United States Patent
Abe et al.

(10) Patent No.: US 8,559,226 B2
(45) Date of Patent: Oct. 15, 2013

(54) THRESHOLD DETECTING METHOD AND VERIFY METHOD OF MEMORY CELLS

(75) Inventors: Katsumi Abe, Yokohama (JP); Masahiro Yoshihara, Yokohama (JP); Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 13/052,148

(22) Filed: Mar. 21, 2011

(65) Prior Publication Data
US 2011/0305089 A1 Dec. 15, 2011

(30) Foreign Application Priority Data
Jun. 10, 2010 (JP) .................................. 2010-133142

(51) Int. Cl.
*G11C 16/04* (2006.01)
(52) U.S. Cl.
USPC .................................. 365/185.17; 365/185.22
(58) Field of Classification Search
USPC .......................... 365/185.17, 185.18, 185.22
See application file for complete search history.

(56) References Cited

U.S. PATENT DOCUMENTS

| | | | |
|---|---|---|---|
| 7,196,933 | B2 | 3/2007 | Shibata |
| 2004/0057318 | A1 | 3/2004 | Cernea et al. |
| 2004/0213031 | A1 | 10/2004 | Hosono et al. |
| 2005/0146959 | A1 | 7/2005 | Shiga |
| 2006/0034140 | A1 | 2/2006 | Ogawa et al. |
| 2006/0050562 | A1 | 3/2006 | Cernea et al. |
| 2006/0126392 | A1* | 6/2006 | Shibata .................... 365/185.22 |
| 2006/0285391 | A1 | 12/2006 | Cernea |
| 2007/0279992 | A1* | 12/2007 | Cernea et al. ............. 365/185.21 |
| 2008/0019188 | A1* | 1/2008 | Li ............................. 365/185.22 |
| 2008/0158986 | A1 | 7/2008 | Elmhurst et al. |
| 2008/0266965 | A1* | 10/2008 | Takeuchi et al. ......... 365/185.17 |
| 2009/0073771 | A1* | 3/2009 | Li ............................. 365/185.22 |
| 2009/0237992 | A1 | 9/2009 | Maejima |
| 2009/0244969 | A1 | 10/2009 | Maejima |
| 2009/0323426 | A1 | 12/2009 | Tanaka et al. |
| 2010/0135078 | A1 | 6/2010 | Iwai et al. |
| 2012/0127800 | A1 | 5/2012 | Lutze et al. |

FOREIGN PATENT DOCUMENTS

| | | |
|---|---|---|
| JP | 9-35486 | 2/1997 |
| JP | 2004-326866 | 11/2004 |
| JP | 2005-196871 | 7/2005 |
| JP | 2006-500727 | 1/2006 |
| JP | 2006-79803 | 3/2006 |
| JP | 2006-508483 | 3/2006 |
| JP | 2006-172523 | 6/2006 |
| JP | 2008-547149 | 12/2008 |
| JP | 2009-522707 | 6/2009 |

(Continued)

OTHER PUBLICATIONS

Office Action in Japanese Application No. 2010-133142 mailed on Apr. 9, 2013.

*Primary Examiner* — Huan Hoang
(74) *Attorney, Agent, or Firm* — Oblon, Spivak, McClelland, Maier & Neustadt, L.L.P.

(57) ABSTRACT

According to one embodiment, a threshold detecting method for detecting threshold values of nonvolatile semiconductor memory cells comprises applying a preset voltage to a word line connected to the memory cells, and performing bit-line sense at two different timings during discharging of one of a bit line connected to the memory cells and a node corresponding to the bit line, while a potential of the word line is kept constant.

8 Claims, 13 Drawing Sheets

(56) References Cited

FOREIGN PATENT DOCUMENTS

| | | |
|---|---|---|
| JP | 2009-230777 | 10/2009 |
| JP | 2009-230818 | 10/2009 |
| JP | 2009-545093 | 12/2009 |
| JP | 2010-9722 | 1/2010 |
| JP | 2010-515201 | 5/2010 |
| JP | 2010-134984 | 6/2010 |
| JP | 2010-529585 | 8/2010 |
| JP | 2012-507818 | 3/2012 |
| WO | WO 2008/083125 A1 | 7/2008 |
| WO | WO 2010/051116 A1 | 5/2010 |

* cited by examiner

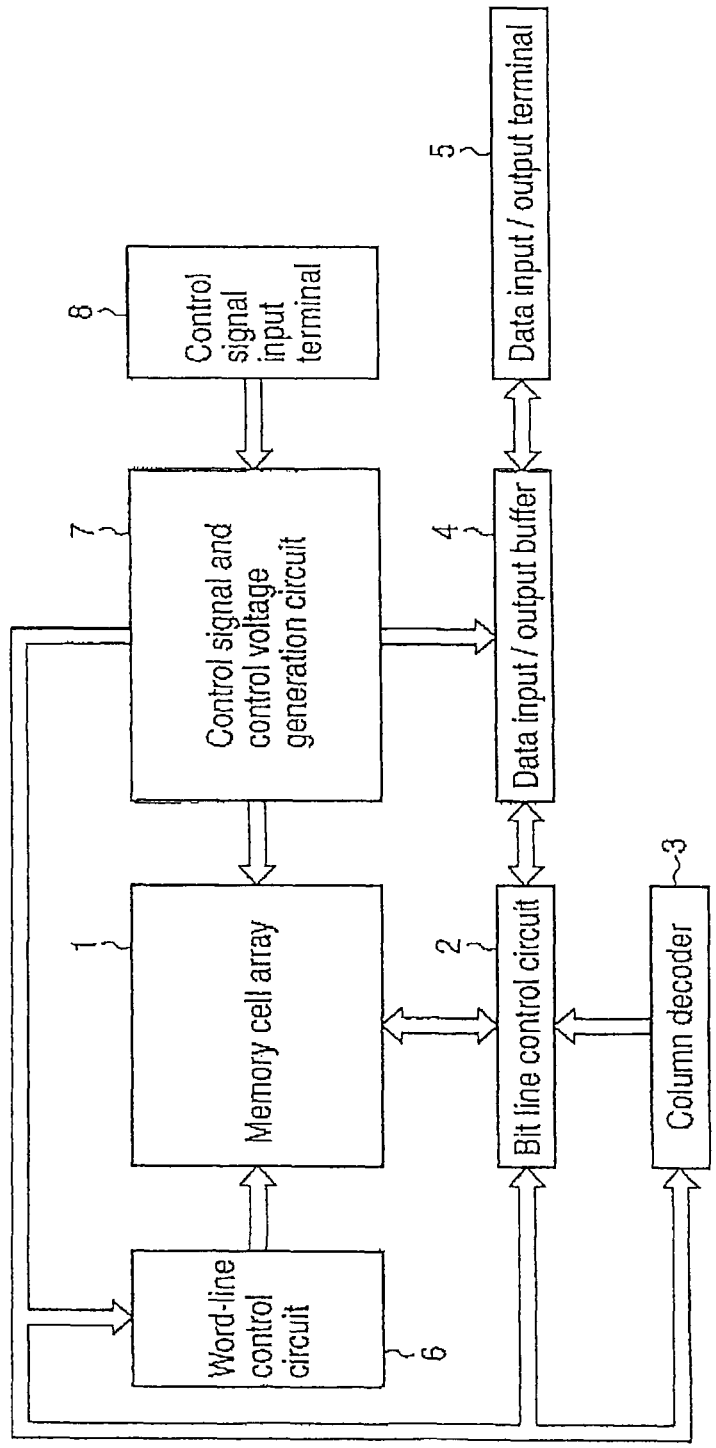
F I G. 1

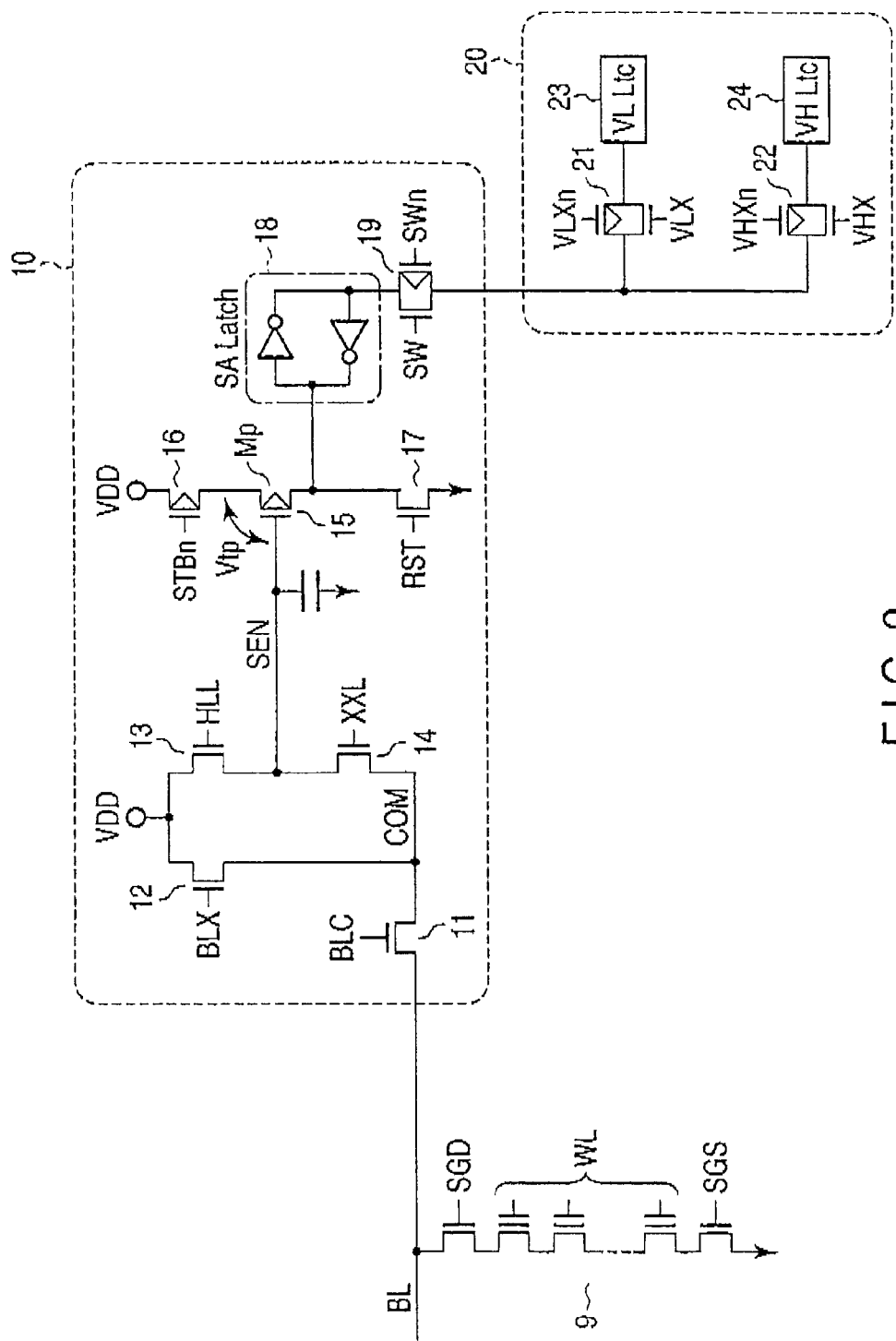
F I G. 2

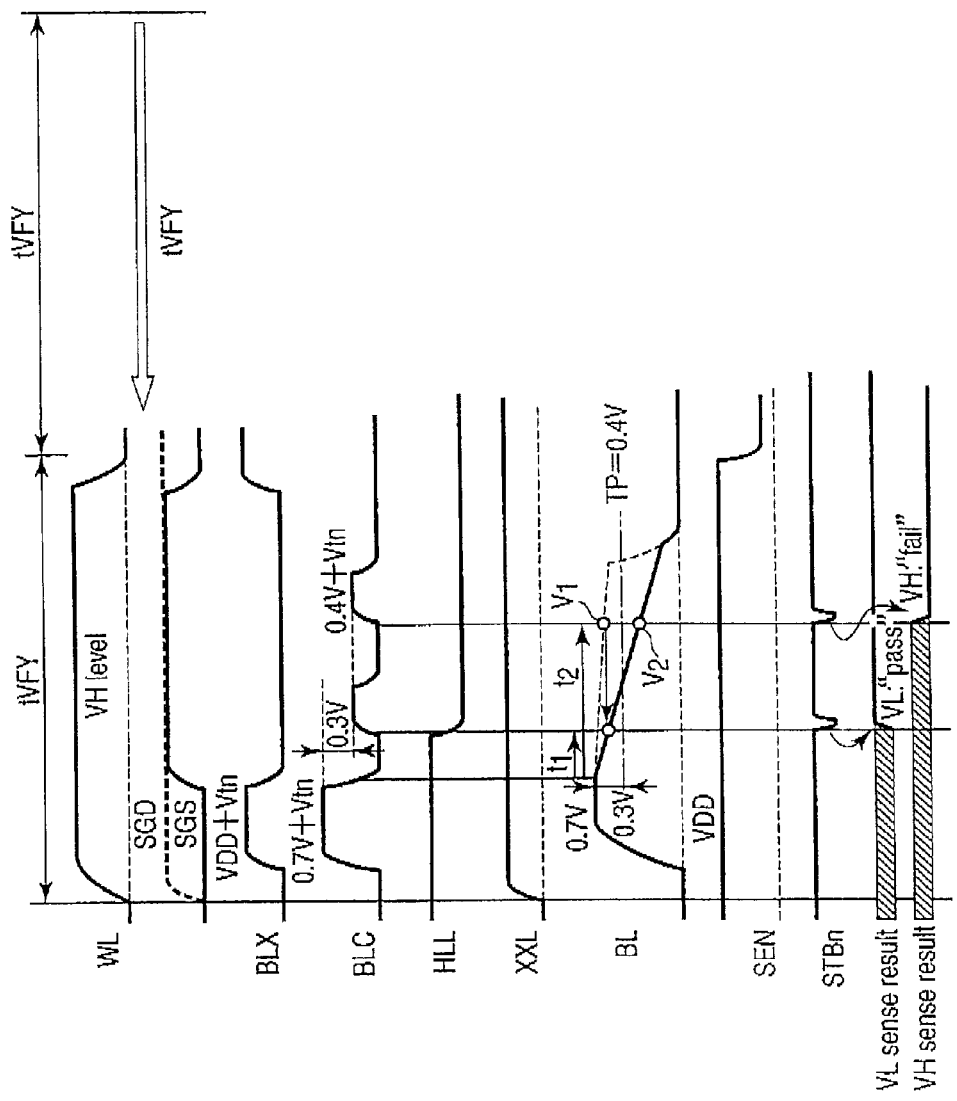
F I G. 5

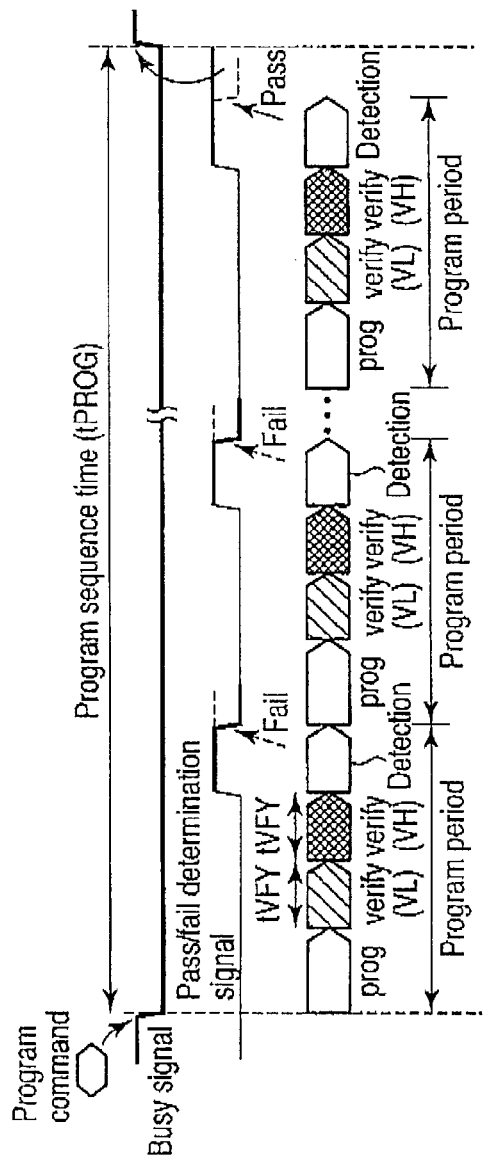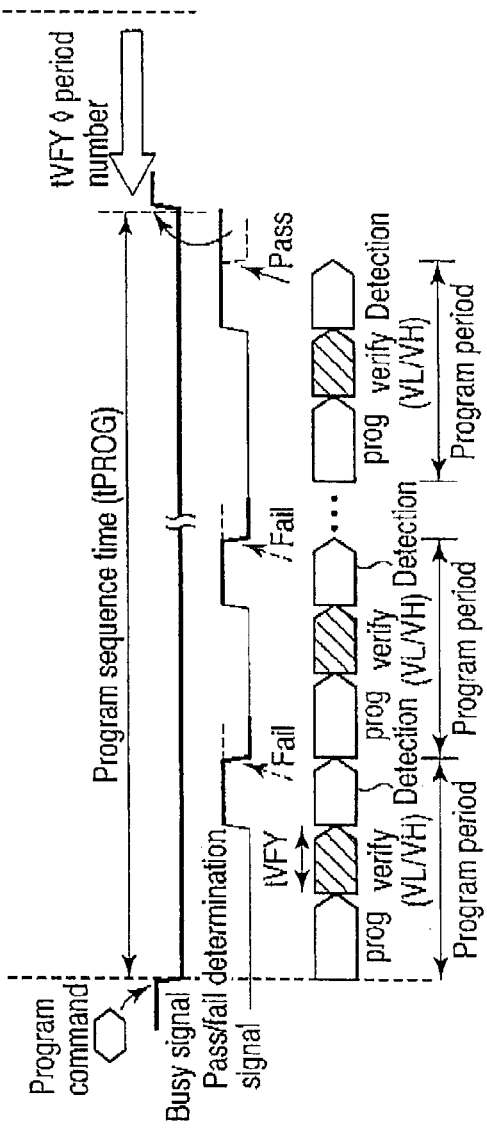
F I G. 7A
F I G. 7B

# THRESHOLD DETECTING METHOD AND VERIFY METHOD OF MEMORY CELLS

CROSS-REFERENCE TO RELATED APPLICATIONS

This application is based upon and claims the benefit of priority from Japanese Patent Application No. 2010-133142, filed Jun. 10, 2010; the entire contents of which are incorporated herein by reference.

FIELD

Embodiments described herein relate generally to a threshold detecting method and verify method for detecting threshold values of memory cells used in a nonvolatile semiconductor memory device.

BACKGROUND

As the present NAND flash memory, a so-called multivalue NAND memory in which each memory cell stores plural bits such as two bits (four values), three bits (eight values), or four bits (16 values) in contrast with a conventional binary memory in which each memory cell stores only one bit is dominantly used because of the large memory capacity thereof.

In the multivalue NAND memory, the amount of electrons trapped in a floating gate at the program time, that is, the threshold voltage of a memory cell is changed to 4, 8, 16 steps and multivalue data is stored according to the level in which the threshold voltage is distributed. At the read time, the on/off state of the memory cell is determined while the potential of word line WL is sequentially set on the boundary between the distribution ranges. Then, the distribution range in which the threshold voltage of the memory cell is set is specified to read multivalue data. Individual memory cells to which programming is ended have threshold voltage distribution ranges of respective levels corresponding to stored data. It is considered that the threshold voltage distribution ranges of the multivalue NAND memory in which random data is programmed respectively have 4, 8, 16 normal distribution ranges in the case of 4-value, 8-value, 16-value memories.

In such a multivalue NAND memory, since the number of threshold distribution ranges is greater in comparison with the conventional binary memory, it becomes extremely important to set the width of each distribution range narrow. This is because it becomes impossible to read data by applying a voltage (read level) to WL if the widths of the respective distribution ranges are widened and overlapped with one another when programmed data is read.

BRIEF DESCRIPTION OF THE DRAWINGS

FIG. 1 is a block diagram showing the schematic configuration of a nonvolatile semiconductor memory device used in a first embodiment.

FIG. 2 is a circuit configuration diagram showing the configuration of a sense amplifier module used in the nonvolatile semiconductor memory device of FIG. 1.

FIG. 5 is a signal waveform diagram showing a J-QPW verify operation according to a first embodiment.

FIGS. 7A, 7B are diagrams showing program sequence times of the first embodiment and comparison example in comparison with each other.

DETAILED DESCRIPTION

Figure 3:
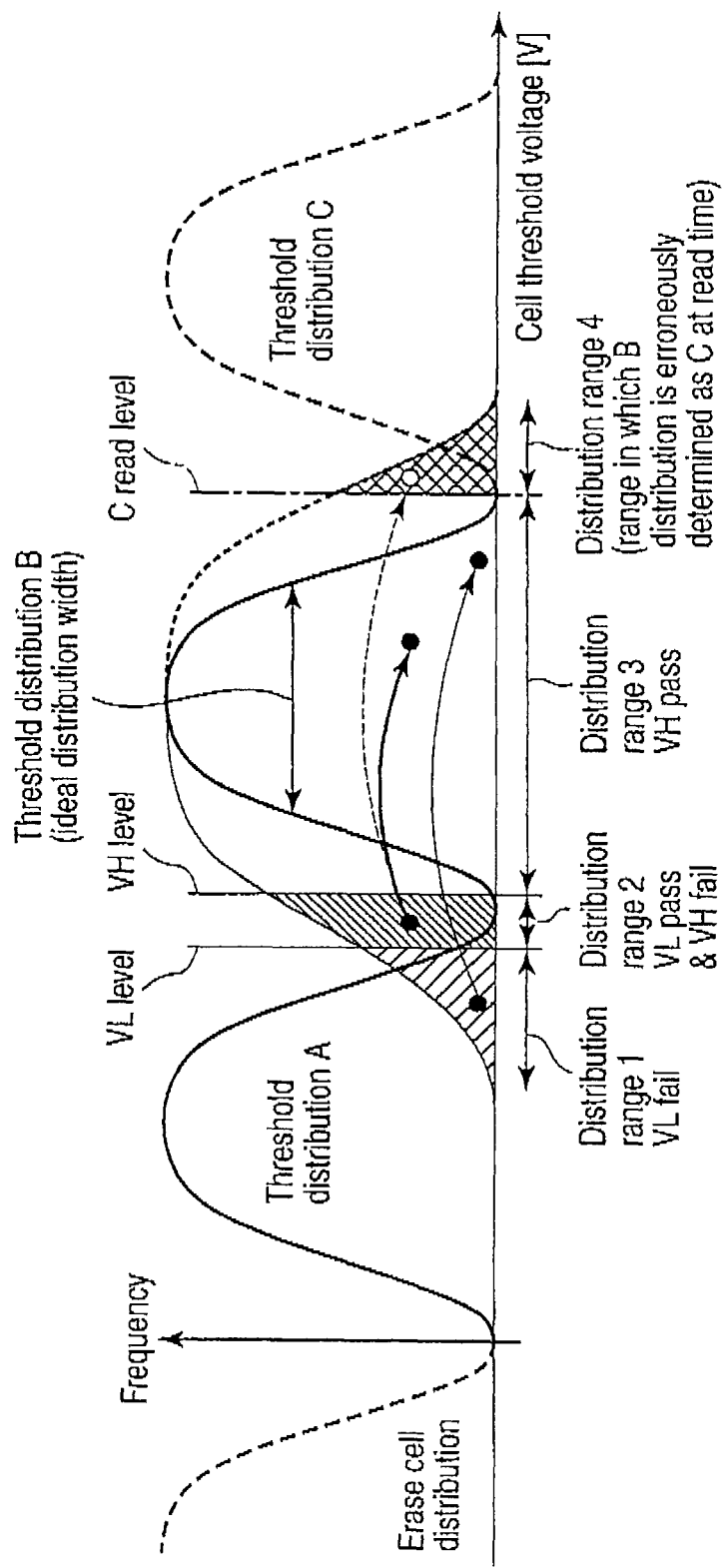
FIG. 3 is a cell threshold distribution diagram for illustrating the concept of QPW verify.

In general, according to one embodiment, a threshold detecting method for detecting threshold values of nonvolatile semiconductor memory cells comprises applying a preset voltage to a word line connected to the memory cells, and performing bit-line sense at two different timings during discharging of one of a bit line connected to the memory cells and a node corresponding to the bit line, while a potential of the word line is kept constant.

Next, the detail content of the embodiment is explained with reference to the drawing.

(First Embodiment)

FIG. 1 is a block diagram showing the schematic configuration of a nonvolatile semiconductor memory device used in a first embodiment or a NAND flash memory that stores multivalue data.

A memory cell array 1 includes a plurality of bit lines, a plurality of word lines and common source line and electrically data reprogrammable memory cells formed of EEPROM cells, for example, are arranged therein in a matrix form. Specifically, NAND cell units each having a plurality of memory cells serially connected are connected between the plural bit lines and the common source line. To the memory cell array 1, a bit-line control circuit 2 that controls the bit lines and a word-line control circuit 6 are connected.

The bit-line control circuit 2 includes a plurality of data storage circuits and sense amplifier circuits. The bit-line control circuit 2 reads data of the memory cell in the memory cell array 1 via the bit line, detects the state of the memory cell in the memory cell array 1 via the bit line or applies a program control voltage to the memory cell in the memory cell array 1 via the bit line to program data in the memory cell. Further, a column decoder 3 and data input/output buffer 4 are connected to the bit-line control circuit 2. One of the data storage circuits in the bit-line control circuit 2 is selected by means of the column decoder 3. Data of the memory cell read to the data storage circuit is output to the exterior from a data input/output terminal 5 via the data input/output buffer 4.

Program data input to the data input/output terminal 5 from the exterior is input to the data storage circuit selected by means of the column decoder 3 via the data input/output buffer 4.

The word-line control circuit 6 is connected to the memory cell array 1. The word-line control circuit 6 selects the word line in the memory cell array 1 and applies a voltage required for reading, writing or erasing to the selected word line.

The memory cell array 1, bit-line control circuit 2, column decoder 3, data input/output buffer 4 and word-line control circuit 6 are connected to a control signal and control voltage generation circuit 7 and controlled by the control signal and control voltage generation circuit 7. The control signal and control voltage generation circuit 7 is connected to a control signal input terminal 8 and controlled by a control signal input from the exterior via the control signal input terminal 8. The bit-line control circuit 2, column decoder 3, word-line control circuit 6 and control voltage generation circuit 7 configure a program circuit and read circuit.

FIG. 2 is a circuit configuration diagram showing an example of the concrete configuration of a sense amplifier circuit provided in the bit-line control circuit 2.

The sense amplifier circuit includes a sense amplifier 10 connected to bit line BL of the memory cell array 1 and a latch module 20 that stores a sense result of the sense amplifier 10. The sense amplifier 10 includes an nMOS transistor 11 connected between bit line BL and a COM node, an nMOS transistor 12 connected between the COM node and power source terminal VDD, an nMOS transistor 13 connected between VDD and a SEN node, an nMOS transistor 14 connected between the SEN node and the COM node, a pMOS transistor 15 whose gate is connected to the SEN node, a pMOS transistor 16 connected between VDD and the drain of the transistor 15, an nMOS transistor (reset transistor) 17 connected between the source of the transistor 15 and a ground terminal, a sense latch 18 configured by an inverter and a transmission gate 19.

The latch module 20 includes transmission gates 21, 22 and latches 23, 24. The latch 23 latches a first detection result obtained at a first read level (VL) and the latch 24 latches a second detection result obtained at a second read level (VH).

In FIG. 2, a symbol 9 indicates a NAND cell unit including a series-connection circuit of a plurality of memory cells and select transistors connected to both ends of the series-connection circuit.

Now, the concept of a verify operation is explained before explaining the operation of the first embodiment.

As one of methods for suppressing the distribution width of threshold voltages of memory cells in a narrow range, the technique of Quick Pass Write (QPW) is proposed. The concept of QPW is explained below with reference to FIG. 3 by taking a 4-value memory cell as an example. In FIG. 3, the abscissa indicates a cell threshold voltage and the ordinate indicates the frequency of occurrence of threshold values.

The number of threshold distribution ranges of the 4-value memory cell is four, one of them is an erase cell distribution range to which a cell in the erase state belongs and other cells are separately programmed into three distribution ranges in the programming process. In this case, it is assumed that A, B, C are attached to the three distribution ranges in this order starting from the distribution range closest to the erase cell distribution range. FIG. 3 shows the threshold distribution when programming to the memory cell in threshold distribution range B is performed after programming to the memory cell in threshold distribution range A is terminated.

Memory cells lying in a distribution range 1 and distribution range 2 that exist near the boundary between threshold distribution ranges A and B are cells that are to be originally programmed in threshold distribution range B (distribution range 3). However, since a verify level (VH level) is not yet exceeded, a program voltage is applied in a next program loop.

In this case, the threshold voltage of a cell that exists in the distribution range 1 rises to the distribution range 3 at the next program voltage application time and programming is terminated. However, there occurs a possibility that the cell existing in the distribution range 2 jumps over the distribution range 3 and reaches a distribution range 4 if a normal program voltage is applied thereto (over-programming). Even if the cell reaches the distribution range 4, the verify result of a B level becomes pass since a VH sense level is exceeded. However, if reading of a C read level is performed after programming up to threshold distribution range C is finally terminated, the distribution range is erroneously determined as distribution range C although it should be originally determined as distribution range B.

The step-up value of a program voltage to be applied may be set small in order to prevent over-programming. However, in this case, there occurs a problem that the number of program loops until the end of programming increases and the program time is extended.

As means for solving the above problem, QPW verify is proposed. With this technique, it is possible to detect a cell existing in the distribution range 2 (VL: pass, VH: fail) by first performing first verify by using a voltage slightly lower than an original verify level (VH level) and then performing second verify by using a VH level.

In a detected memory cell (bit), a potential difference between WL and the channel is set lower than that of a normal programmed cell and a shifting amount of the threshold value caused by programming is reduced by applying a program voltage to WL after charging the bit line by using an intermediate potential that is called a QPW voltage. As a result, the threshold voltage finally reached can be suppressed in the distribution range 3 without increasing the number of program loops.

Figure 4:
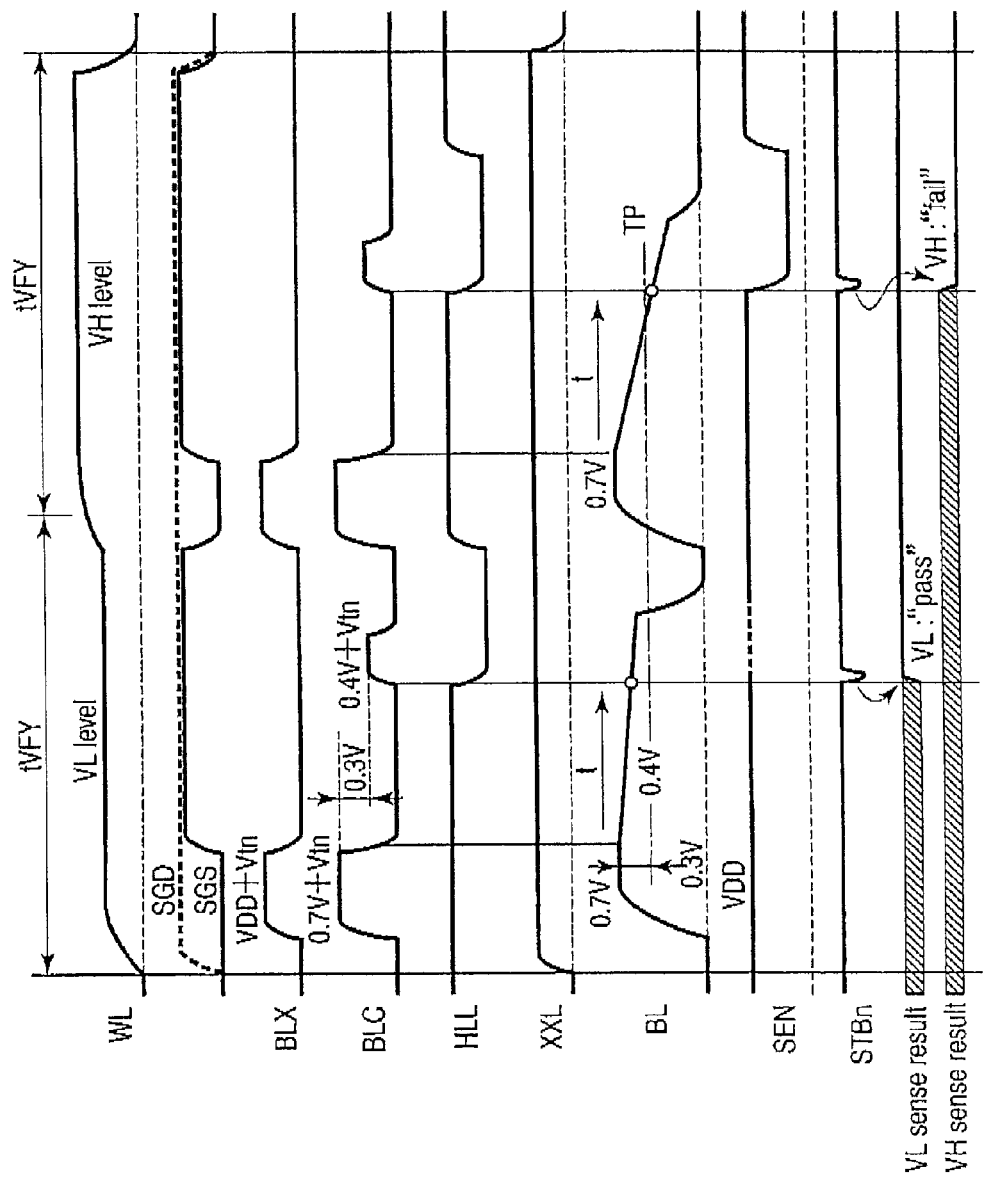
FIG. 4 is a signal waveform diagram showing a bias sense QPW verify operation in a comparison example.

Next, a QPW verify operation as a first comparison example is explained with reference to FIG. 4.

First, word line WL is set to a VL level and only the potential of drain-side select gate SGD is raised while SGS that is a source-side select gate of a memory cell is kept at GND level. Then, charging of bit line BL is started by raising BLX and BLC to preset levels, for example, (VDD+Vtn) and (0.7 V+Vtn), respectively. Since SGS is now set off and the memory cell does not pass a current, bit line BL is charged to 0.7 V clamped by BLC.

Next, if BLX and BLC are lowered to GND level and, at the same time, SGS is raised, discharging of bit line BL is started. If BLC is raised to a slightly lower level (VSEN level) after the elapse of preset sense time t from start of discharging, the state of bit line BL is fetched into the sense amplifier 10.

Since the word-line level is low at the VL sense time and a current passed by the memory cell is small, the level of bit line BL after the elapse of sense time t is set to a potential higher than a VSEN level of 0.4 V. At this time, since $V_{GS}$ of BLC does not exceed the threshold value, the level of the SEN node is kept at almost VDD. The state of the SEN node is stored in the latch module 20 as a VL sense result by making STBn low in this state.

Bit line BL may be discharged after the end of sense or recharged as it is. However, since discharging is performed once in this case, recharging is performed before shifting to next sense. That is, VH sense is performed by raising word line WL to a VH level after lowering SGS to GND level once and performing the same operation. Since the word-line level is high in VH sense, a current passed by the memory cell is large and the inclination of bit-line discharging becomes steep.

If the potential of bit line BL becomes lower than a VSEN level of 0.4 V after the elapse of sense time t, the transistor of BLC is turned on and charge sharing occurs between bit line BL and the SEN node. Generally, since the parasitic capacitance of bit line BL is extremely large in comparison with that of the SEN node, charges of the SEN node instantly flow into the bit-line side and the sense result is instantaneously determined.

The result of VH sense can be obtained by storing the potential of the SEN node to the latch module 20 by using STBn.

The sense result of bit line BL is determined with a logical inversion level (trip-point [TP]) of the sense amplifier 10 used as a reference, it is determined as binary 1 (pass) if the bit-line potential is higher than the reference at the timing of a sense signal and it is determined as binary 0 (fail) if the bit-line potential is lower. After the end of VH sense, the logical operation of VL sense and VH sense is performed by using the sense results of VL and VH to detect a memory cell existing in the distribution range 2 used as an object of QPW.

As described above, an advantage that the threshold distribution range of the memory cells can be suppressed narrow by performing QPW verify is attained. However, since sense of bit line BL is performed twice for VL, VH, it is necessary to take the verify time that is approximately twice the normal verify time (tVFY) without using QPW. Particularly, since it is necessary to switch the level of a word line having large load capacitance halfway, the configuration is disadvantageous in reducing the verify time.

Next, a threshold detecting method according to the first embodiment that solves the above problem is explained. FIG. 5 is a signal waveform diagram showing a QPW verify operation according to the first embodiment.

In this embodiment, word line WL is first set at a VH level and kept constant. Only drain-side select gate SGD is raised while SGS that is a source-side select gate of a memory cell is kept at GND level. Then, BLX and BLC are raised to preset levels, for example, (VDD+Vtn) and (0.7 V+Vtn), respectively, to start charging of bit line BL. Since SGS is now set off and the memory cell does not pass any current, bit line BL is charged to 0.7 V clamped by BLC.

Next, if BLX and BLC are lowered to GND level and, at the same time, SGS is raised, discharging of bit line BL is started. At this time, since the potential of word line WL is as high as VH, the discharging speed of bit line BL becomes higher than that when word line WL is set to VL.

If the sense time (time t1) is adjusted to raise BLC to a slightly low level (VSEN level) and set the same equivalent to a sense point (potential v1) at the VL sense time of the first comparison example, the state of bit line BL is fetched into the sense amplifier 10. As a result, word line WL is set to the VH level, but the state in which the word-line level is set relatively low can be simulated by reducing the sense time. In this state, the state of the SEN node is stored in the latch 20 by making STBn low.

Subsequently, if the same operation is performed in sense time t2 (t2=t>t1), VH sense is performed. If the potential of bit line BL becomes lower than a VSEN level of 0.4 V after the elapse of sense time t2, the transistor of BLC is turned on and charge sharing occurs between bit line BL and the SEN node. Generally, since the parasitic capacitance of bit line BL is extremely large in comparison with that of the SEN node, charges of the SEN node instantly flow into the bit-line side and the sense result is instantaneously determined.

The result of VH sense can be obtained by storing the potential of the SEN node in the latch module 20 by using STBn. That is, both of VL sense and VH sense can be performed without switching the potentials of word line WL. In other words, VL and VH sense results can be obtained in one cycle by performing sense twice with a time difference during one bit-line discharging.

As described above, if time at which the bit-line potential reaches VL can be detected by adjusting a timing of a first sense signal, the verify time can be reduced by tVFY in comparison with that of conventional QPW verify. Such a QPW system is referred to as J-QPW (QPW at time) verify.

Figure 6:
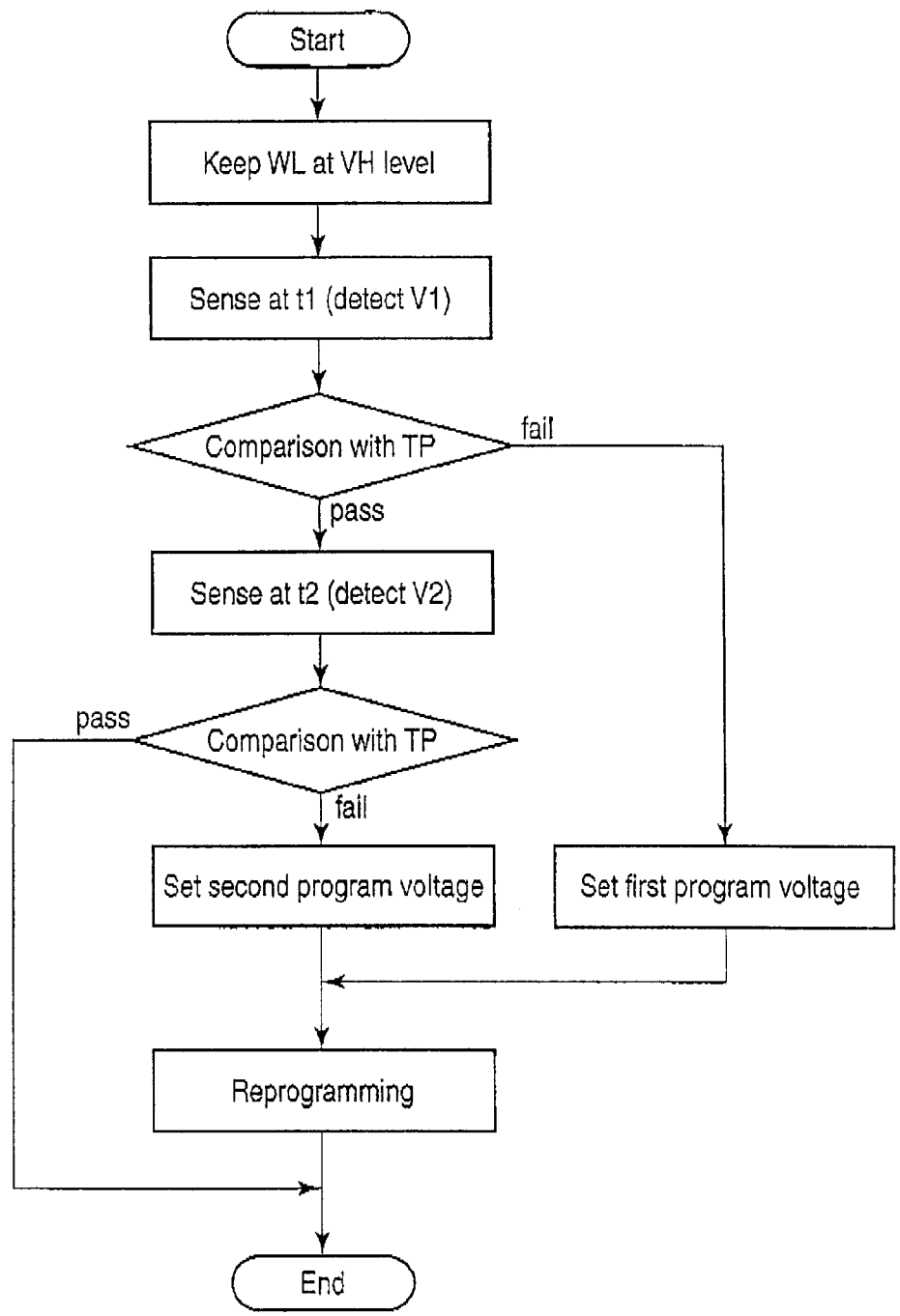
FIG. 6 is a flowchart for illustrating a program operation by J-QPW verify according to the first embodiment.

Verify programming according to the VL sense result and VH sense result is performed as shown in the flowchart of FIG. 6, for example. That is, if the VL sense result based on sense time t1 in the state in which word line WL is held at the VH level is fail, reprogramming is performed based on a normal program voltage (first program voltage). If the VL sense result based on sense time t1 is pass and the VH sense result based on sense time t2 is fail, a program voltage (second program voltage) lower than the normal program voltage is set and reprogramming is performed at this level. Specifically, the bit line is set to a QPW voltage to reduce the potential difference between WL and the channel and reprogramming is performed. If the VH sense result is pass, reprogramming is not performed since sufficient programming is already performed. An optimum threshold value can be set in the selected memory cell by thus performing verify programming.

FIGS. 7A, 7B are diagrams showing the configurations of whole program sequences containing QPW verify for comparison, FIG. 7A shows a case wherein QPW verify of a first comparison example is used and FIG. 7B shows a case wherein J-QPW of the first embodiment is used.

In the first comparison example, when a program command is received from the exterior of a chip, a Busy signal is made low to set the chip to a BUSY state.

First, a program operation is performed and a program voltage is applied to word line WL to perform first programming for the memory cell. Then, a verify operation for VL sense and VH sense explained with reference to FIG. 4 is performed and a detecting operation is performed after the end of verify.

In the detecting operation, whether programming for all of the memory cells is ended or not is determined based on the sense result of verify. When the detecting operation is started, a pass/fail signal is once made high. If programming is terminated, the program sequence is terminated while the pass/fail signal is kept high and the Busy signal returns to being high.

However, if programming is not terminated, the pass/fail signal is made low and a next program•period is started. At this time, the program•period indicates a period in which a series of operations from the program operation to the detecting operation are collectively performed.

As described above, the program•period is repeated until programming for all of the memory cells of the page is terminated and the time required for the Busy signal to finally return to being high is set to program sequence time (tPROG).

Therefore, if the verify time is extended, it becomes very important to reduce the verify time in order to reduce program sequence time (tPROG) since tPROG increased by (period number) times gives an influence.

On the other hand, in J-QPW verify of the first embodiment, since two verify operations including VL verify and VH verify are not contained in the program period and only one verify operation of VL/VH is contained, the program-period itself is shortened. That is, since only one verify operation is contained in one program•period when J-QPW of the first embodiment is used, the whole program sequence time is reduced by tVFY·(period number) in comparison with the first comparison example.

As described above, in the first embodiment, the VL and VH sense results can be obtained in a period that is approximately half the period of conventional QPW verify and the cell threshold distribution width can be suppressed narrow without increasing program sequence time.

Thus, according to this embodiment, when the threshold value of the nonvolatile semiconductor memory cell is detected, bit line BL can be sensed with two different read levels without switching the potential of word line WL halfway and the threshold value of the memory cell can be detected in a short period of time. Therefore, QPW verify can be performed without extending verify time and data programming speed can be enhanced.

(Second Embodiment)

In the conventional NAND flash memory, an error may occur in the sense result by capacitive coupling between adjacent bit lines during sensing in read or verify. In order to prevent this, it is common practice to use a system in which bit lines BL are divided into two groups of even-numbered bit lines (referred to as even bit lines) and odd-numbered bit lines (referred to as odd bit lines), only one of the bit-line groups is activated and the other bit-line group is used as a shield line.

In the above system, different page addresses are assigned to the even bit-line group and odd bit-line group and the groups are selected by the different page addresses.

However, products that utilize an All Bit Line (ABL) system in which programming is simultaneously performed for all of bit lines BL to reduce program time in the recent NAND flash memory start to come on the market.

In such a system, all of the bit lines are activated to perform the program operation, but independent sense for even and odd bit lines is still necessary in the verify operation accompanied thereby. Therefore, even if the same page address is assigned, the respective bit-line groups are time-divisionally sensed. Such a sense system is referred to as even/odd separate (SOS) sense.

Figure 8:
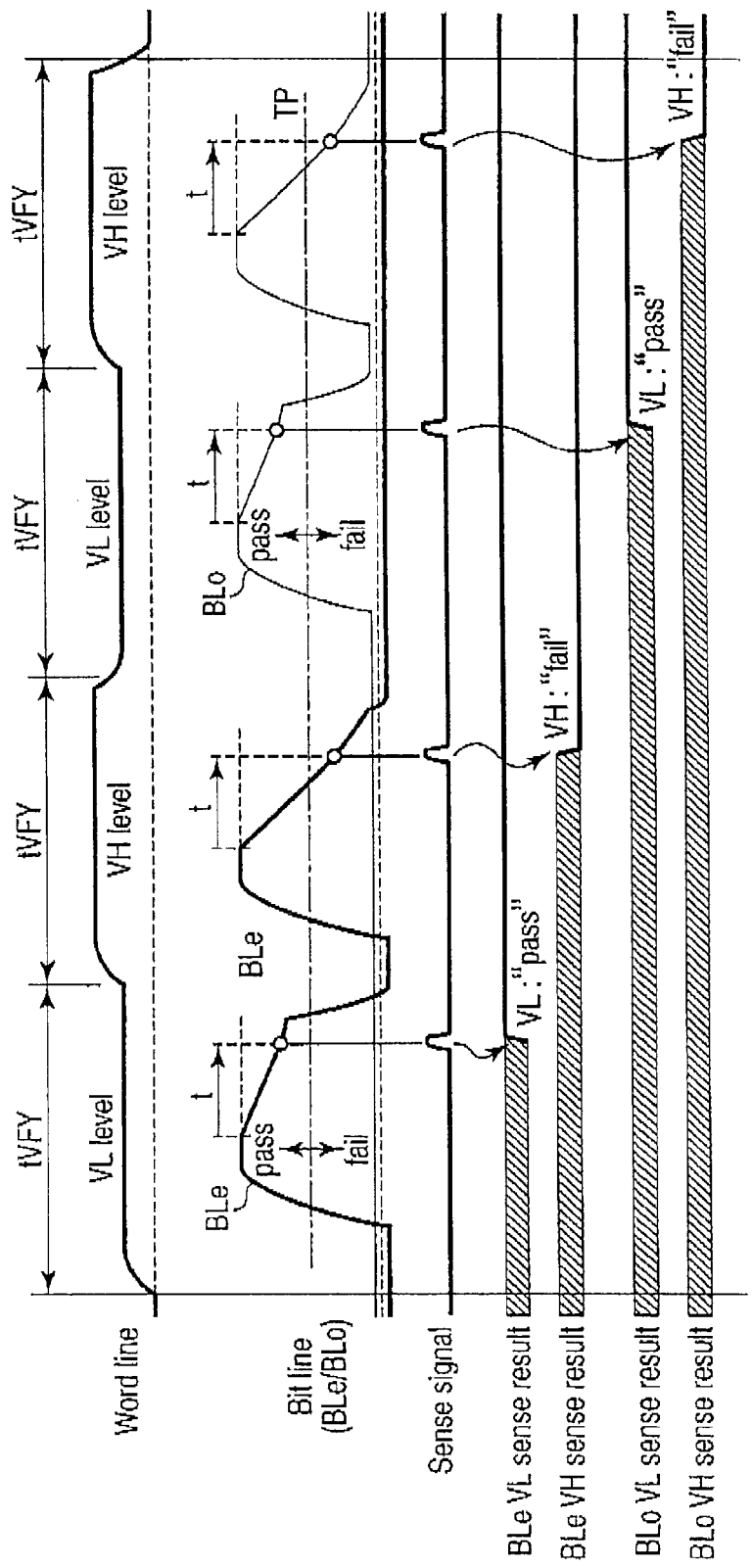
FIG. 8 is a signal waveform diagram showing an EOS-QPW verify operation in a second comparison example.

FIG. 8 is a timing chart when QPW verify is applied in an EOS sense system as a second comparison example.

First, word line WL is set to a VL level and bit line BL is initially charged to sense an even bit line (BLe). At this time, an odd bit line (BLo) is fixed at GND level and functions as a shield line with respect to BLe.

Then, bit-line discharging is started via the memory cell connected to BLe and a sense signal is output to perform VL sense for BLe after the elapse of preset time t (sense time). The result is held as a VL sense result for BLe in a storage element such as a latch.

Next, word line WL is set to a VH level to perform VH sense for BLe. Also, the sense result obtained at this time is held as a VH sense result for BLe. When QPW verify for BLe is terminated, BLe is set to GND level to make ready for next BLo sense.

Subsequently, word line WL is set to the VL level again to initially charge BLo and sense is performed when sense time t has passed after bit-line discharging via the connected memory cell was started. The sense result at this time is held as a VL sense result for BLo.

Then, word line WL is set to the VH level to perform VH sense for BLo. The result is held as a VH sense result for BLo.

Finally, if BLo sense is terminated, the logical operation of the VL sense result and VH sense result for the sense results of the respective bit-line groups is performed to detect a memory cell existing in the distribution range 2 used as an object of QPW.

As described above, if QPW verify by the MOS sense system is used, programming in which the threshold distribution range of the memory cells is suppressed narrow can be performed in the program sequence of the ABL system. However, when the verify time is taken into consideration, a time of 4·tVFY is required and an impact given to tPROG becomes relatively large.

Figure 9:
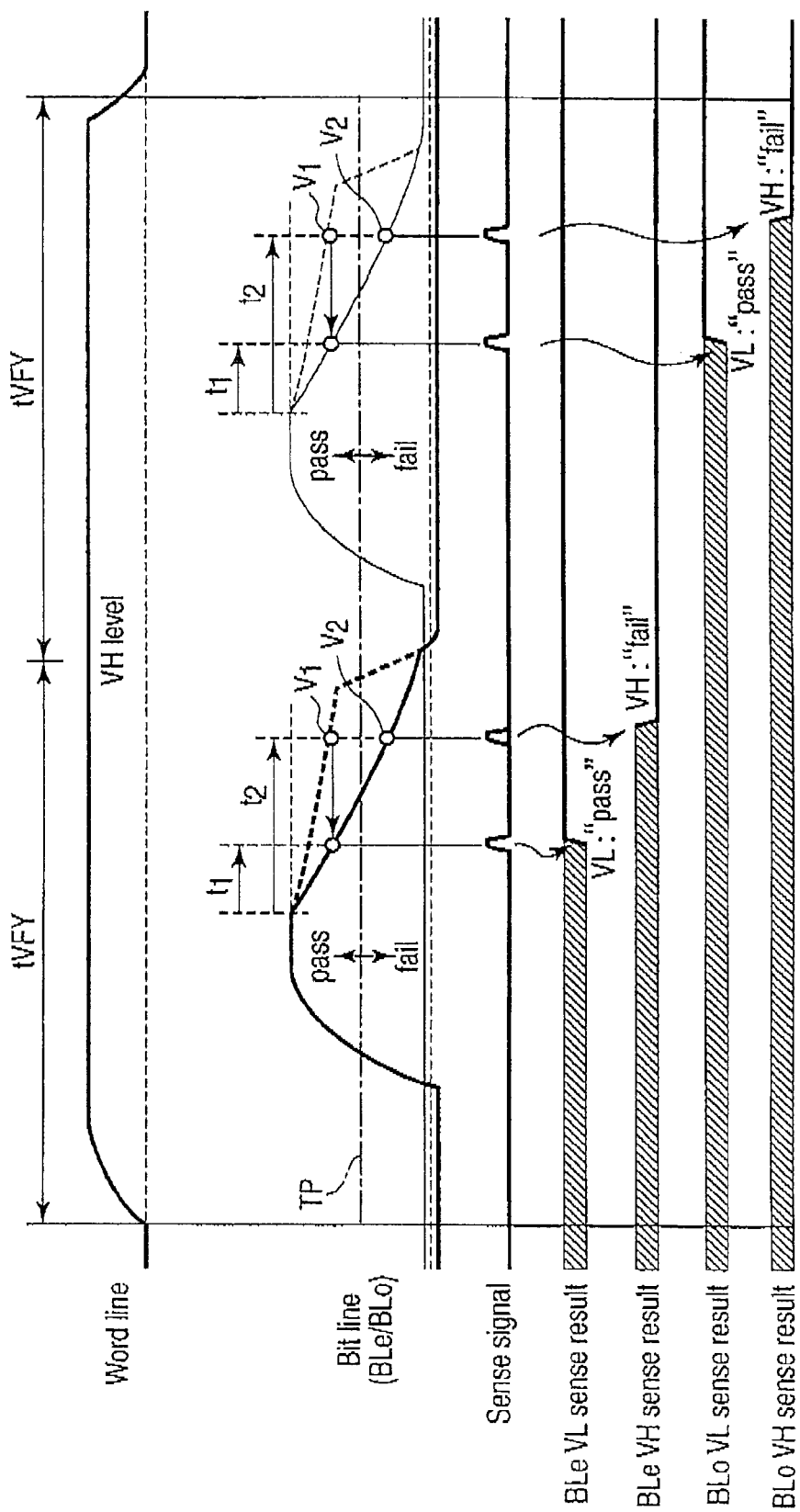
FIG. 9 is a signal waveform diagram showing an EOS-J-QPW verify operation according to a second embodiment.

Next, a threshold detecting method according to the second embodiment that solves the above problem is explained. FIG. 9 is a timing chart for illustrating a QPW verify operation according to the second embodiment. In this example, J-QPW verify is applied to an EOS sense system.

First, word line WL is charged to a VH level and even bit line BLe is selected and initially charged. After start of bit-line discharging, a sense signal is output to perform bit-line sense after the elapse of VL level sense time t1. The result is held as a VL sense result for BLe.

As in the first embodiment, since the potential of word line WL is set as high as VH, bit-line discharging speed becomes higher than that when word line WL is set to VL. Further, sense time t1 may be set equivalent to a sense point (potential v1) at the VL sense time of the second comparison example.

Bit-line discharging proceeds and a sense signal is output again to perform bit-line sense after the elapse of sense time t2 (=t). The result is held as a VH sense result for BLe.

After the end of BLe sense, BLe is reset to GND to start initial charging of BLo. Also, with respect to BLo, a sense signal is output twice after t1, t2 after start of bit-line discharging and the respective sense results are held.

Finally, if BLo sense is terminated, the logical operation of VL sense and VH sense is performed with respect to the sense results of the respective bit-line groups to detect a memory cell existing in the distribution range 2 used as an object of QPW.

As described above, when J-QPW verify is applied to the EOS sense system, the verify time can be suppressed to approximately half that of the conventional EOS verify system. Further, since it is not necessary to switch the potential of word line WL having large load capacity in the course of verify, not only time can be further reduced but also current consumption can be suppressed.

Figures 10A, 10B:
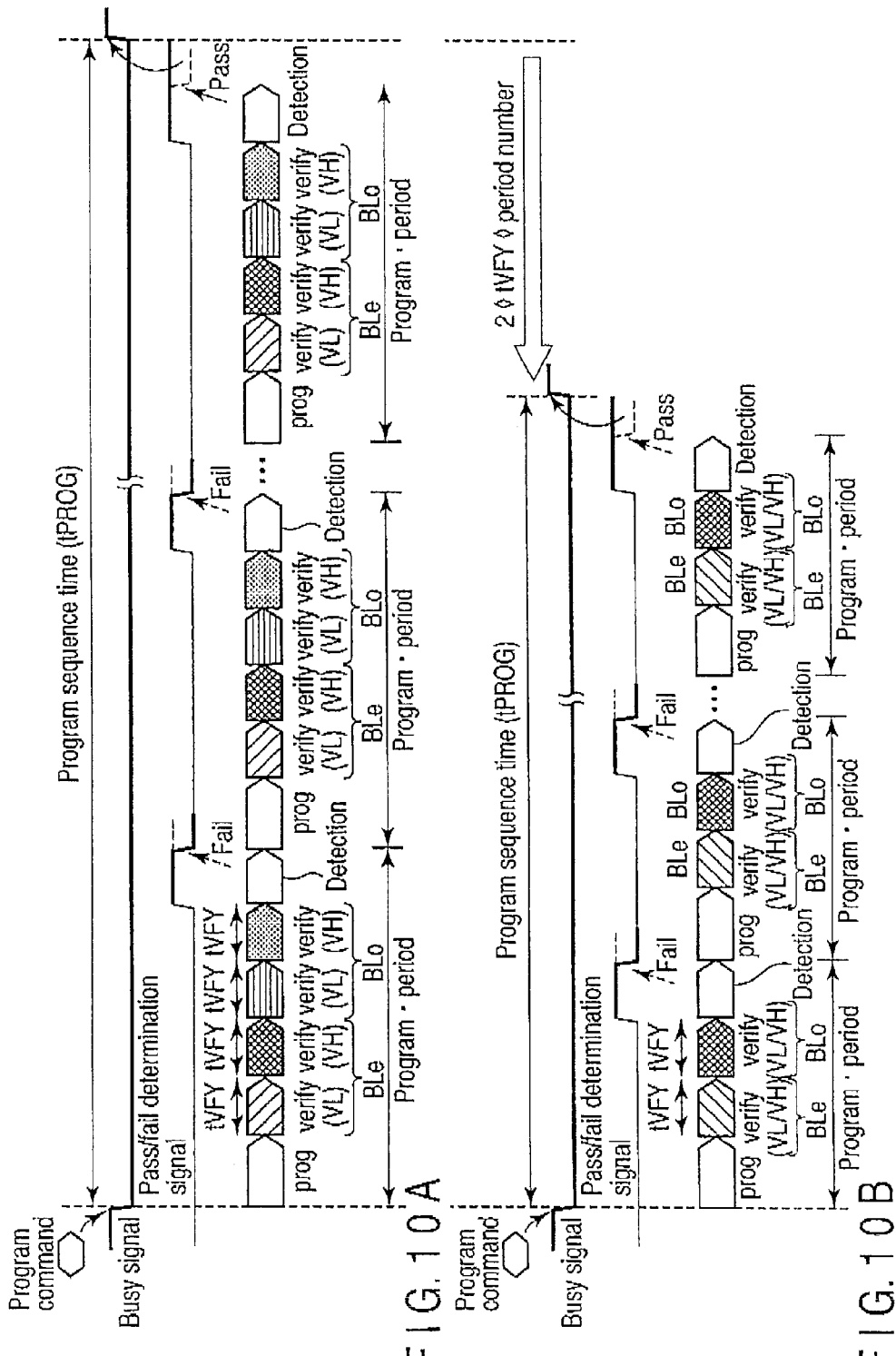
FIGS. 10A, 10B are diagrams showing program sequence times of the second embodiment and second comparison example in comparison with each other.

FIGS. 10A, 10B are diagrams showing the configurations of whole program sequences including QPW verify in comparison with each other, FIG. 10A shows a case wherein EOS-QPW verify of a second comparison example is used and FIG. 10B shows a case wherein EOS-QPW verify of the second embodiment is used.

In EOS-QPW verify shown in FIG. 10A, the verify time required for VL, VH senses for BLe, BLo is extended twice in comparison with QPW verify using no EOS of FIG. 7A. When the whole program sequence is considered, the program sequence time (tPROG) is extended by 2·tVFY·(program•period number) and it is said that the advantage of the ABL system that the program time can be reduced cannot be fully utilized.

On the other hand, when EOS-J-QPW of the second embodiment shown in FIG. 10B is used, only two verify operations for BLe, BLo are performed. That is, in the EOS program sequence of the second comparison example, four verify operations including operations for VL, VH for BLe and VL, VH for BLo are contained in one program•period, but in EOS-J-QPW of the second embodiment, only two verify operations for BLe, BLo are contained. Therefore, the whole program sequence time in the second embodiment can be reduced by 2·tVFY·(period number) in comparison with the second comparison example.

As described above, in the second embodiment, the VL and VH sense results can be acquired in almost half the time of the conventional EOS-QPW verify even if the EOS sense system is used and the cell threshold distribution width can be suppressed narrow without increasing the program sequence time. Further, since word-line charging and discharging can be performed once in a verify time, it becomes advantageous in reducing current consumption.

(Third Embodiment)

In the second embodiment, EOS sense in which bit-line groups are time-divisionally sensed is explained although the ABL system is used, but a system in which bit-line groups are simultaneously sensed is explained below.

Figure 11:
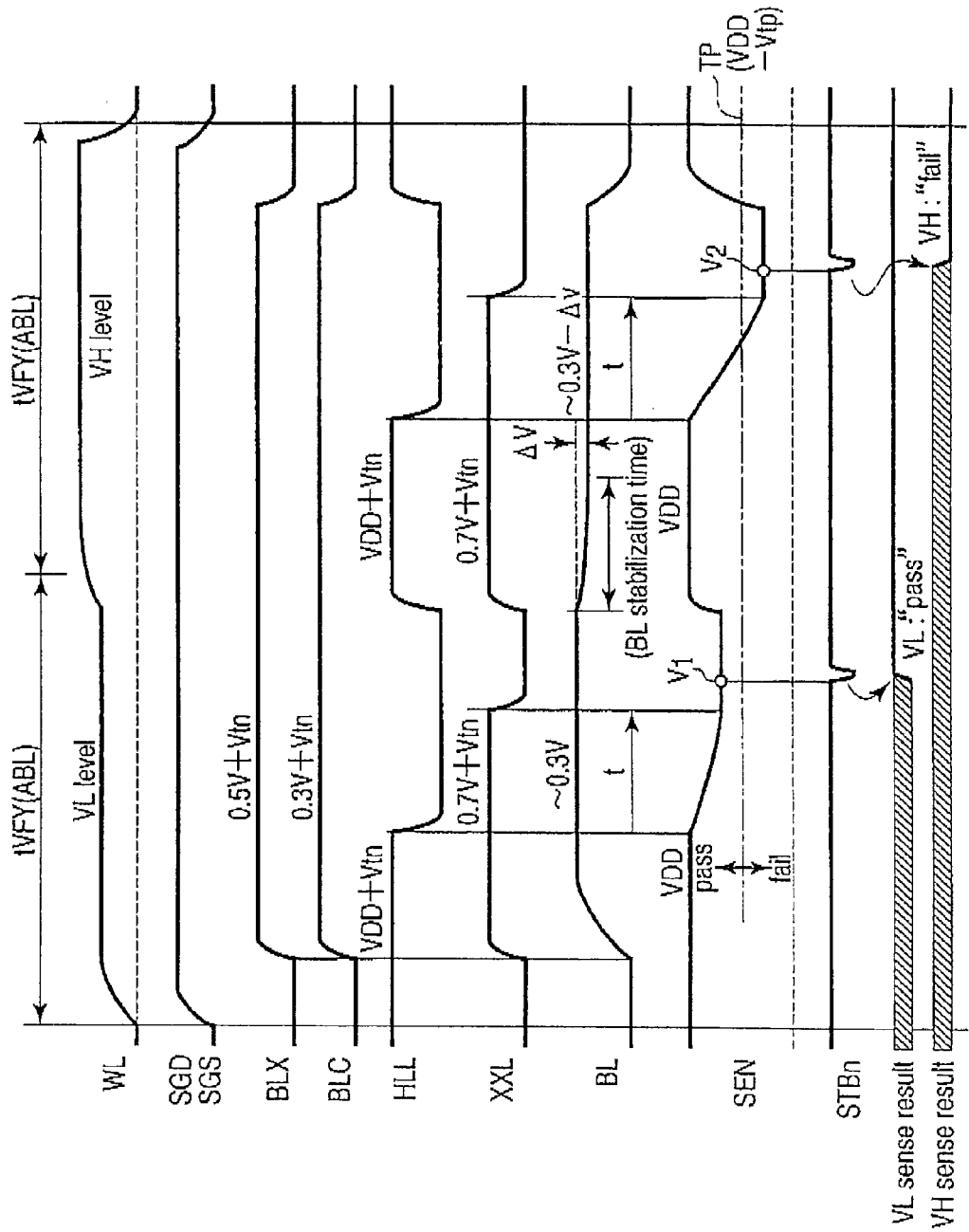
FIG. 11 is a signal waveform diagram showing a QPW verify operation of an ABL sense system in a third comparison example.

FIG. 11 is a timing chart of QPW verify in an ABL sense system as a third comparison example. In this case, as the sense amplifier circuit, the same circuit as shown in FIG. 2 is used.

First, word line WL is set to a verify LOW (L) level and SGD and SGS are turned on (potential is raised). Then, BLC, BLX and XXl are respectively raised to (0.3V+Vtn), (0.5V+Vtn) and (0.7V+Vtn) (Vtn indicates a threshold voltage of a transistor configuring the sense amplifier) to start bit-line charging.

At this time, the COM node of a sense amplifier 10 is clamped at 0.7 V by XXL and BLX is cut off. Further, an SEN node is charged to VDD by HLL (VDD+Vtn level) and bit line BL is set to approximately 0.3 V that is a potential with a drop of the threshold voltage of BLC and kept at substantially a constant potential.

If HLL is dropped to GND level in this state, the SEN node comes to have no charging path and discharging caused by a current of the memory cell starts. However, since the COM node is clamped from 0.7 to 0.5 V, the bit-line potential is kept at 0.3 V.

With the above configuration, since bit line BL can be kept set at the constant potential during sensing, all of bit lines BL can be simultaneously activated.

If XXL is dropped to GNP level when t (sense time) has elapsed after HLL was dropped to GND level to start discharging of the SEN node, discharging of the SEN node is stopped. If STBn is made low in this state, the sense result is fetched in a latch module. If the potential of the SEN node is higher than a trip point (VDD-Vtp [Vtp is a threshold voltage of pMOS transistor Mp]), (potential v1) is set to Pass and the VL sense result goes high.

Although not shown in the drawing, the result is stored in a latch 23 for VL of a latch module 20 provided separately from the sense amplifier 10 by setting the relationship of SW=High, SWn=Low and VLX=High, VLXn=Low and then the sense latch is initialized by making ROT high.

Further, if a level of word line WL is switched to a VH level at the same time as HLL, XXL are returned to the original state, the on-resistance of the memory cell is reduced and the potential of bit line BL is lowered by ΔV in comparison with 0.3 V set at the VL sense time. At this time, in order to prevent a bad influence from being given to the sense result of the VH level, it is necessary to take a sufficiently long time for stabilizing the potential of bit line BL.

If the potential of bit line BL becomes stable, HLL is dropped to GND level as in the case of VL sense to start discharging of the SEN node. XXL is set to GND level after the elapse of t (sense time) to stop discharging of the SEN node and then the sense result is fetched into a sense latch by STBn.

If the potential of the SEN node at this time is lower than the trip point, (potential v2) is set to Fail and the VH sense result goes low. As in the case of VL sense, the result is stored in a latch 24 for VH from the sense latch.

Then, a bit that lowers a program voltage in a next program operation is determined based on data of the two sense results. However, there occurs a problem that verify time tVFY(ABL) is extended twice in QPW verify of the ABL sense system.

Figure 12:
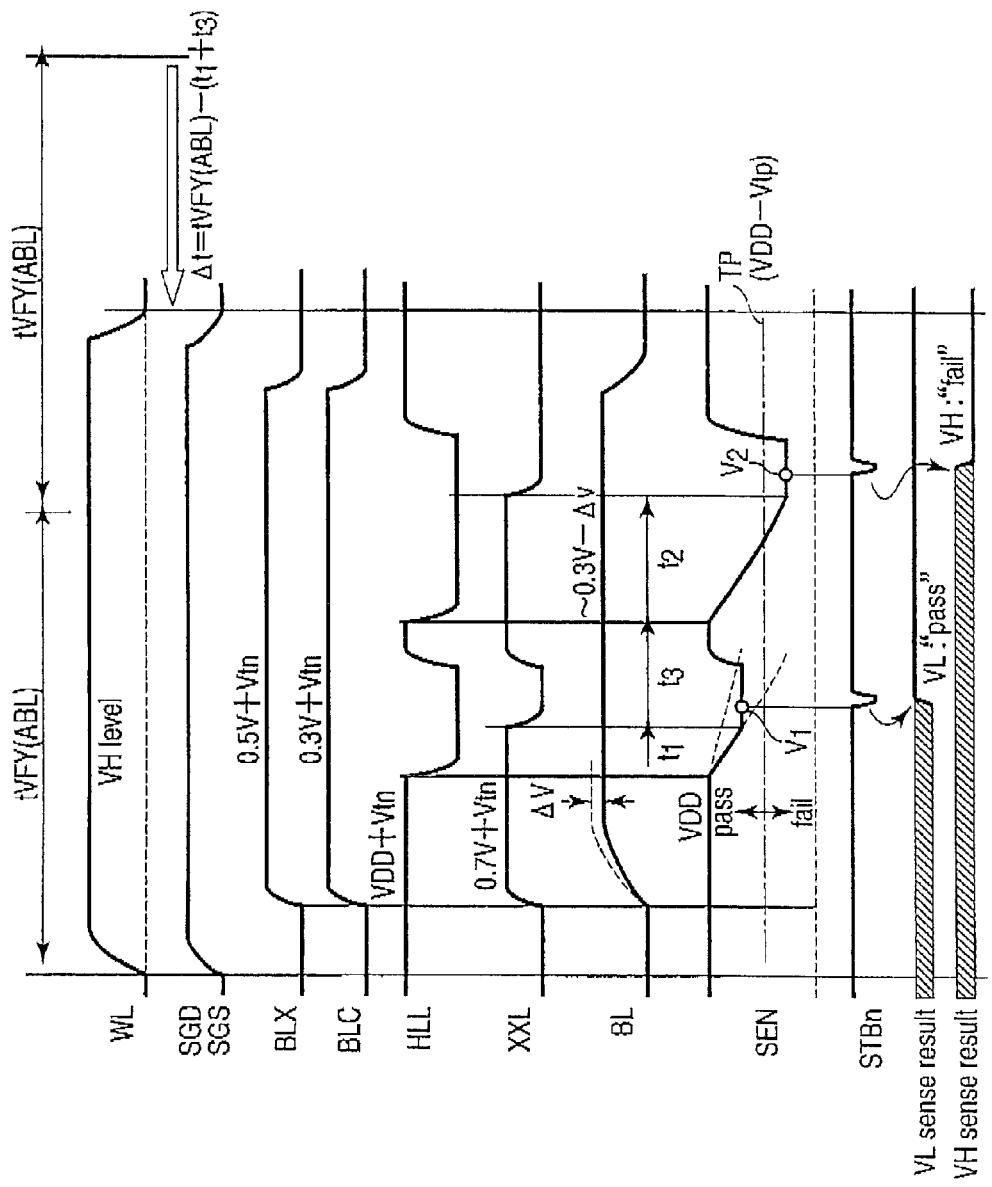
FIG. 12 is a signal waveform diagram showing a QPW verify operation of an ABL sense system according to a third embodiment.

Next, a threshold detecting method according to the third embodiment that solves the above problem is explained. FIG. 12 is a timing chart showing a QPW verify operation of an ABL sense system according to the third embodiment.

First, word line WL is set to a verify High (VH) level and SGD and SGS are turned on (potential is raised). Then, BLC, BLX and XXl are respectively raised to (0.3V+Vtn), (0.5V+Vtn) and (0.7V+Vtn) to start bit-line charging. At this time, since the word-line level is higher than VL, the bit-line potential is stably set at a potential that is lower than 0.3 V by ΔV.

In this state, if HLL is dropped to GND level, discharging of the SEN node is started. At this time, the sense time (time t1) is adjusted to set the potential equal to the sense point (potential v1) at the VL sense time in the third comparison example and XXL is dropped to GND level. As a result, word line WL is set at a VH level, but the state in which the word-line level is set relatively low can be simulated by reducing the sense time. Then, STBn is made low in this state and the sense result is fetched into the sense latch.

If the potential of the SEN node is higher than the trip point, the potential is set to Pass and the VL sense result goes high and is stored in the latch 23 for VL.

Next, HLL, XXL are returned to the original state and the SEN node is re-charged to VDD (time t3).

After this, HLL is dropped to GND level again to start discharging of the SEN node and XXL is dropped to GND level after the elapse of original sense time t2 (t2=t) at this time to stop discharging of the SEN node.

If the potential of the SEN node at this time is lower than the trip point, (potential v2) is set to Fail and the VH sense result goes low and is stored in the latch 24 for VH.

In the third embodiment, as in the case of QPW verify in the ABL system of the third comparison example, the respective sense results are stored in the latch module 20 and a bit that lowers the program voltage is determined based on the above operations.

By using the above control method, not only the QPW verify effect that is the same as that of the third comparison example can be attained but also it becomes unnecessary to perform word-line switching and securely take a time for stabilizing the bit-line potential and the verify time can be reduced by tVFY(ABL)−(t1+t3). Therefore, a time required for the program sequence can be reduced.

(Fourth Embodiment)

Figure 13:
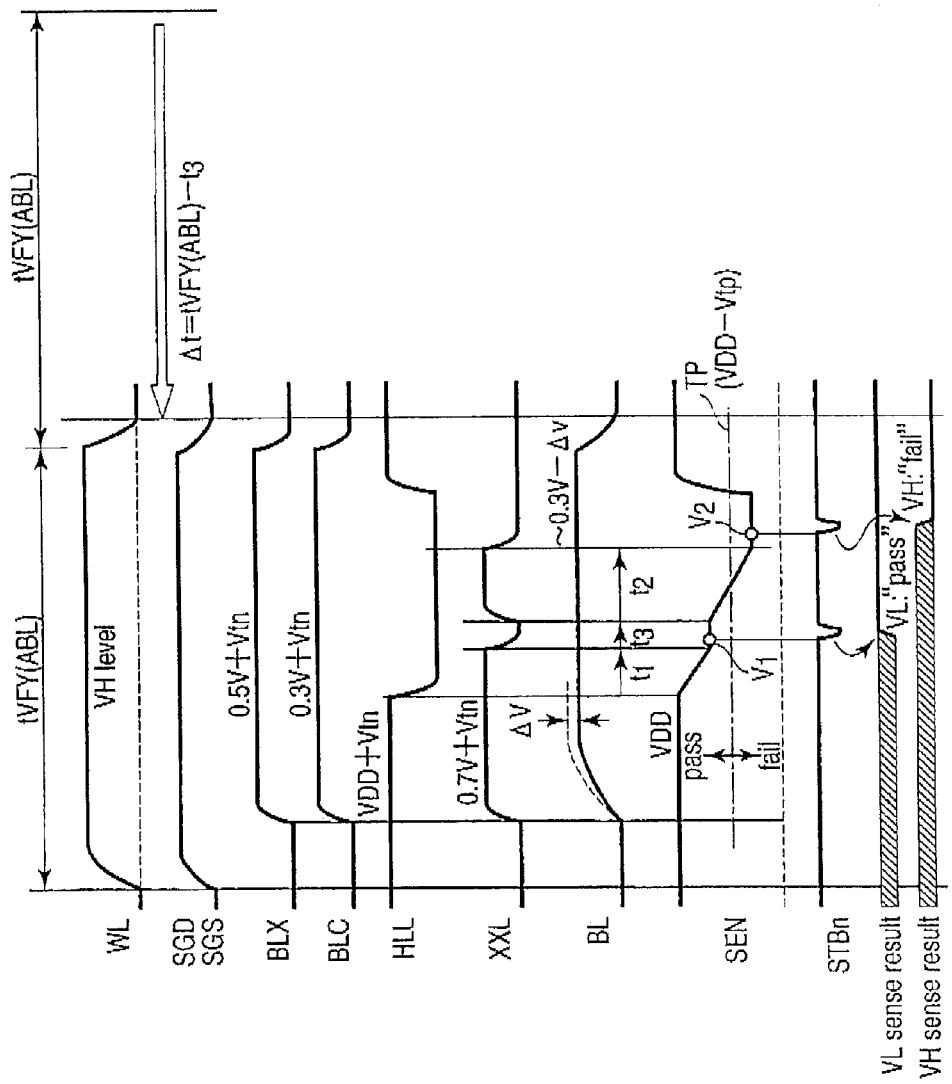
FIG. 13 is a signal waveform diagram showing a QPW verify operation of an ABL sense system according to a fourth embodiment.

FIG. 13 is a timing chart showing a QPW verify operation of an ABL sense system according to a fourth embodiment.

In this embodiment, the verify time in the third embodiment is further reduced. The operation up to the first bit-line charging is the same as that of the third embodiment and the explanation thereof is omitted.

After bit line BL is charged and stabilized at a preset potential (0.3−ΔV), HLL is dropped to GND level to start discharging of a SEN node. As in the third embodiment, the sense time (time t1) is adjusted to set the potential equal to the sense point (potential v1) at the conventional VL sense time. Then, after XXL is dropped to GND level to stop discharging of the SEN node, the sense result is stored in a latch with STBn (the operation up to this is the same as that of the third embodiment).

If the potential of the SEN node at this time is higher than a trip point, the potential is set to Pass and the VL sense result goes high.

After this, if storage of the sense result for VL is terminated, only XXL is returned to the original state while HLL is kept at GND level. As a result, discharging of the SEN node is restarted and XXL is dropped again to GND level after the elapse of sense time (t1+t2+t3) to stop discharging of the SEN node.

Since discharging of the SEN node is stopped in a t3 period in which XXL is dropped, the substantial sense time is set to (t1+t2) and t2 may be adjusted to set this time equal to t of the conventional case.

If the potential of the SEN node at this time is lower than the trip point, the potential is set to Pass and the VH sense result goes high.

Finally, a bit that lowers the program voltage can be determined by performing operations for the VL and VH sense results.

By using the control method of the fourth embodiment, not only the QPW effect that is the same as that of the third comparison example can be attained but also the verify time can be reduced by tVFY(ABL)−t3.

Since t3 is determined based only on the width of STBn and charging time of XXL, a time loss can be suppressed to minimum and the QPW verify time of two times tVFY(ABL) in the third comparison example can be suppressed to substantially half. Therefore, the time required for the program sequence can be greatly reduced.

(Modification)

This invention is not limited to the above embodiments. In the embodiments, an example in which the embodiments are applied to QPW verify is explained, but the threshold detecting method of the embodiments is not necessarily limited to QPW verify. For example, the method can be applied to the read technique (LA read) for correcting the proximity effect of adjacent word lines.

In LA read, word line (WLn+1) adjacent to word line (WLn) that is originally subjected to reading is previously read and data indicating threshold distribution ranges to which the respective memory cells belong is previously stored. The data is used as correction data used when WLn is read later. Then, the read operation is performed plural times for WLn while changing the read level, data items are held and one of the data items to be adopted is selected in the bit unit based on the previously stored correction data. The technique is a technique for performing a read operation in which the influence by the proximity effect caused by the state of a memory cell that is adjacent to a memory cell to be actually read by the above operation.

This embodiment can be applied to the read time of WLn in the above technique and sense results for a plurality of read levels can be obtained in a short period of read time without changing the read level of the word line.

The configuration of the sense amplifier circuit is not limited to the configuration shown in FIG. 2 and can be adequately modified according to the specification. Further, the flash memory is not limited to a NAND type and can be applied to an OR type and others. In addition, this invention can be variously modified and embodied without departing from the scope of this invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for a reading operation on a memory cell of nonvolatile semiconductor, comprising:
    performing a first sense operation during a first period, the first sense operation including:
        applying a first potential to a gate of a first transistor in order to discharge a potential of a SEN node, the first transistor being electrically connected to the SEN node;
        applying a second potential to a gate of a second transistor in order to stop discharging the potential of the SEN node after applying the first potential, the second transistor being electrically connected to the SEN node; and
        applying a third potential to a gate of a third transistor in order to fetch data of the SEN node into a latch circuit in a sense amplifier;
    recharging the SEN node during a second period after the first period, the recharging the SEN node including:
        applying a fourth potential to a gate of a fourth transistor in order to recharge the SEN node; and
    performing a second sense operation during a third period, the second sense operation including:
        applying a fifth potential to the gate of the first transistor in order to discharge the potential of the SEN node;
        applying a sixth potential to the gate of the second transistor in order to stop discharging the potential of the SEN node after applying the fifth potential; and
        applying a seventh potential to the gate of the third transistor in order to fetch a data of the SEN node into the latch circuit.

2. The method according to claim 1, wherein the first period of discharging the SEN node in the first sense operation is different from the third period of re-discharging the SEN node in the second sense operation.

3. The method according to claim 1, wherein the first period of discharging the SEN node in the first sense operation is shorter than the third period of re-discharging the SEN node in the second sense operation.

4. The method according to claim 1, further comprising:
    fetching data of the SEN node into the latch circuit in the sense amplifier after the first period of discharging the SEN node in the first sense operation, and
    fetching data of the SEN node into the latch circuit in the sense amplifier after the third period of re-discharging the SEN node in the second sense operation.

5. The method according to claim 1, further comprising:
    detecting a threshold potential of a selected memory cell based on a first result of the first sense operation and a second result of the second sense operation.

6. The method according to claim 1, wherein a selected memory cell has n storage states in which n is greater than or equal to 3.

7. The method according to claim 1, wherein a threshold potential of a selected memory cell is detected in a verify operation, the verify operation determining whether the threshold potential of the selected memory cell has reached a first level.

8. The method according to claim 7, wherein reprogramming a selected memory cell is controlled based on the threshold potential determined in the verify operation.

\* \* \* \* \*